(12) United States Patent
Yamamoto et al.

(10) Patent No.: US 10,985,017 B2
(45) Date of Patent: Apr. 20, 2021

(54) METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Katsuhiko Yamamoto, Toyama (JP); Takuya Joda, Toyama (JP); Toru Kakuda, Toyama (JP); Sadayoshi Horii, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 116 days.

(21) Appl. No.: 16/285,881

(22) Filed: Feb. 26, 2019

(65) Prior Publication Data

US 2019/0304778 A1 Oct. 3, 2019

(30) Foreign Application Priority Data

Mar. 27, 2018 (JP) .............................. JP2018-060038

(51) Int. Cl.
*H01L 21/318* (2006.01)
*H01L 21/02* (2006.01)
*C23C 8/16* (2006.01)

(52) U.S. Cl.
CPC .......... *H01L 21/02337* (2013.01); *C23C 8/16* (2013.01); *H01L 21/02323* (2013.01); *H01L 21/0223* (2013.01); *H01L 21/02164* (2013.01)

(58) Field of Classification Search
None
See application file for complete search history.

(56) References Cited

U.S. PATENT DOCUMENTS

2001/0029109 A1* 10/2001 Maeda ............. H01L 21/02271
438/778
2011/0065288 A1* 3/2011 Harada .............. F27B 17/0025
438/791

(Continued)

FOREIGN PATENT DOCUMENTS

JP 2009-184865 A 8/2009
JP 4403694 B2 1/2010

(Continued)

OTHER PUBLICATIONS

Office Action in corresponding Korean Patent Application No. 10-2019-0016984, dated Dec. 19, 2019, with English translation.

(Continued)

*Primary Examiner* — Ali Naraghi
(74) *Attorney, Agent, or Firm* — Edell, Shapiro & Finnan, LLC

(57) ABSTRACT

Described herein is a technique capable of improving a quality of a substrate processing performed using hydrogen peroxide. According to one aspect of the technique described herein, there is provided a method of manufacturing a semiconductor device including: (a) supplying a first process gas containing water and a first concentration of hydrogen peroxide to a substrate having a silicon-containing film formed on a surface thereof; and (b) supplying a second process gas containing water and a second concentration of hydrogen peroxide higher than the first concentration to the substrate after (a).

15 Claims, 10 Drawing Sheets

(56) References Cited

U.S. PATENT DOCUMENTS

| | | | |
|---|---|---|---|
| 2012/0060752 A1* | 3/2012 | Kiyotoshi | H01L 21/68707 118/52 |
| 2013/0280911 A1 | 10/2013 | Kai et al. | |
| 2014/0235068 A1* | 8/2014 | Ashihara | H01L 21/02164 438/771 |
| 2015/0140835 A1 | 5/2015 | Tateno et al. | |
| 2015/0298980 A1 | 10/2015 | Hayashi et al. | |

FOREIGN PATENT DOCUMENTS

| | | |
|---|---|---|
| JP | 2011-86908 A | 4/2011 |
| JP | 2013-225577 A | 10/2013 |
| JP | 2014-103351 A | 6/2014 |
| JP | 5710308 B2 | 4/2015 |
| KR | 2001-0095039 A | 11/2001 |
| WO | 2013070343 A1 | 5/2013 |
| WO | 2014021220 A1 | 2/2014 |
| WO | 2014069826 A1 | 5/2014 |

OTHER PUBLICATIONS

Office Action in corresponding Japanese Patent Application No. 2018-060038, dated Apr. 17, 2020, with English translation.

\* cited by examiner

METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. JP 2018-060038 filed on Mar. 27, 2018, the entire contents of which are hereby incorporated by reference.

TECHNICAL FIELD

The present disclosure relates to a method of manufacturing a semiconductor device and a non-transitory computer-readable recording medium.

BACKGROUND

As one of manufacturing processes of a semiconductor device, a substrate processing of processing a film formed on a surface of a substrate may be performed by supplying a process gas containing hydrogen peroxide to the substrate.

SUMMARY

Described herein is a technique capable of improving a quality of a substrate processing performed using hydrogen peroxide.

According to one aspect of the technique described herein, there is provided a method of manufacturing a semiconductor device including: (a) supplying a first process gas containing water and a first concentration of hydrogen peroxide to a substrate having a silicon-containing film formed on a surface thereof; and (b) supplying a second process gas containing water and a second concentration of hydrogen peroxide higher than the first concentration to the substrate after (a).

DETAILED DESCRIPTION

EMBODIMENTS

Hereinafter, one or more embodiments of the technique will be described with reference to FIGS. 1 and 2.

(1) Configuration of Substrate Processing Apparatus

Figure 1:
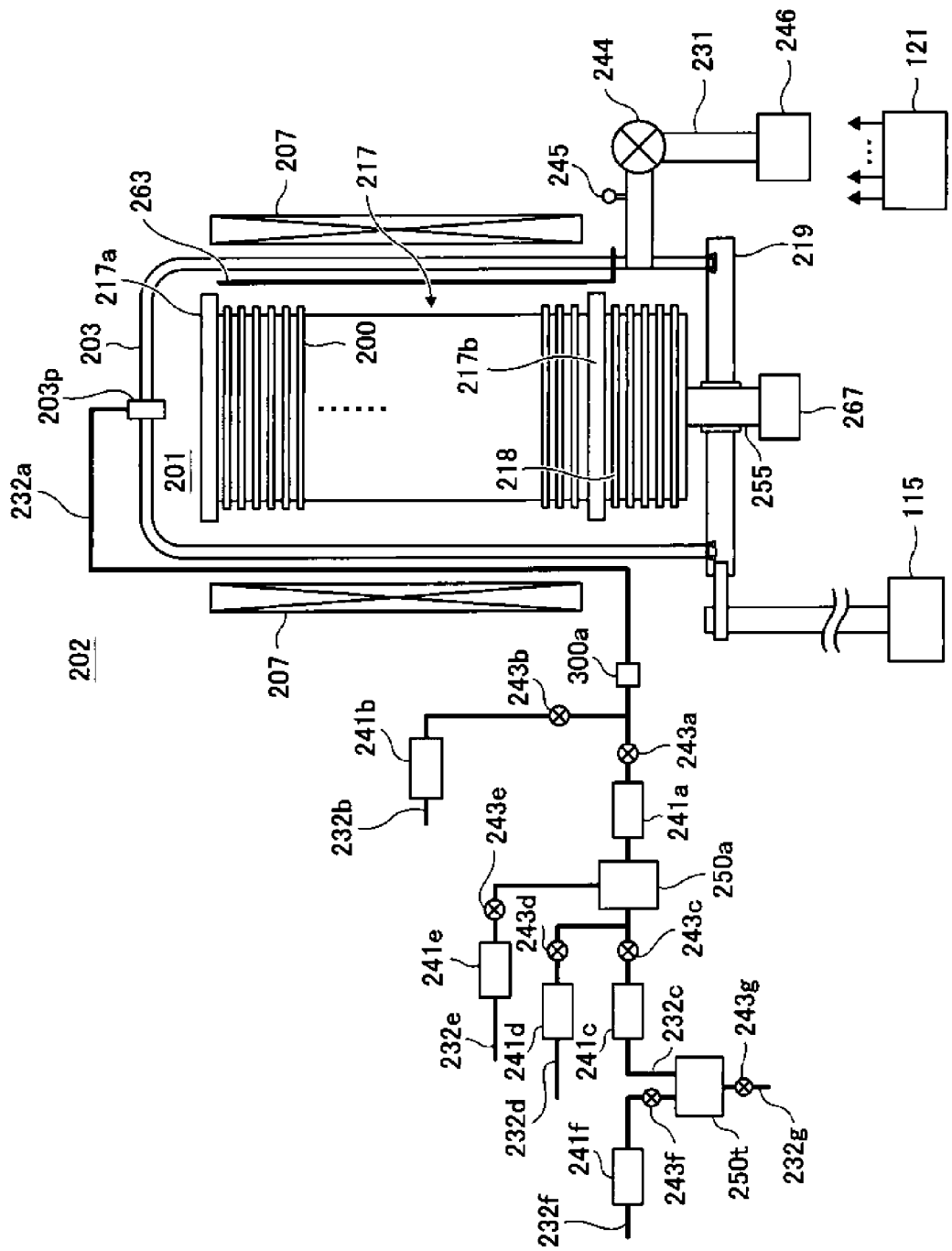
FIG. 1 schematically illustrates a vertical cross-section of a process furnace of a substrate processing apparatus preferably used in one or more embodiments described herein.
Figure 2:
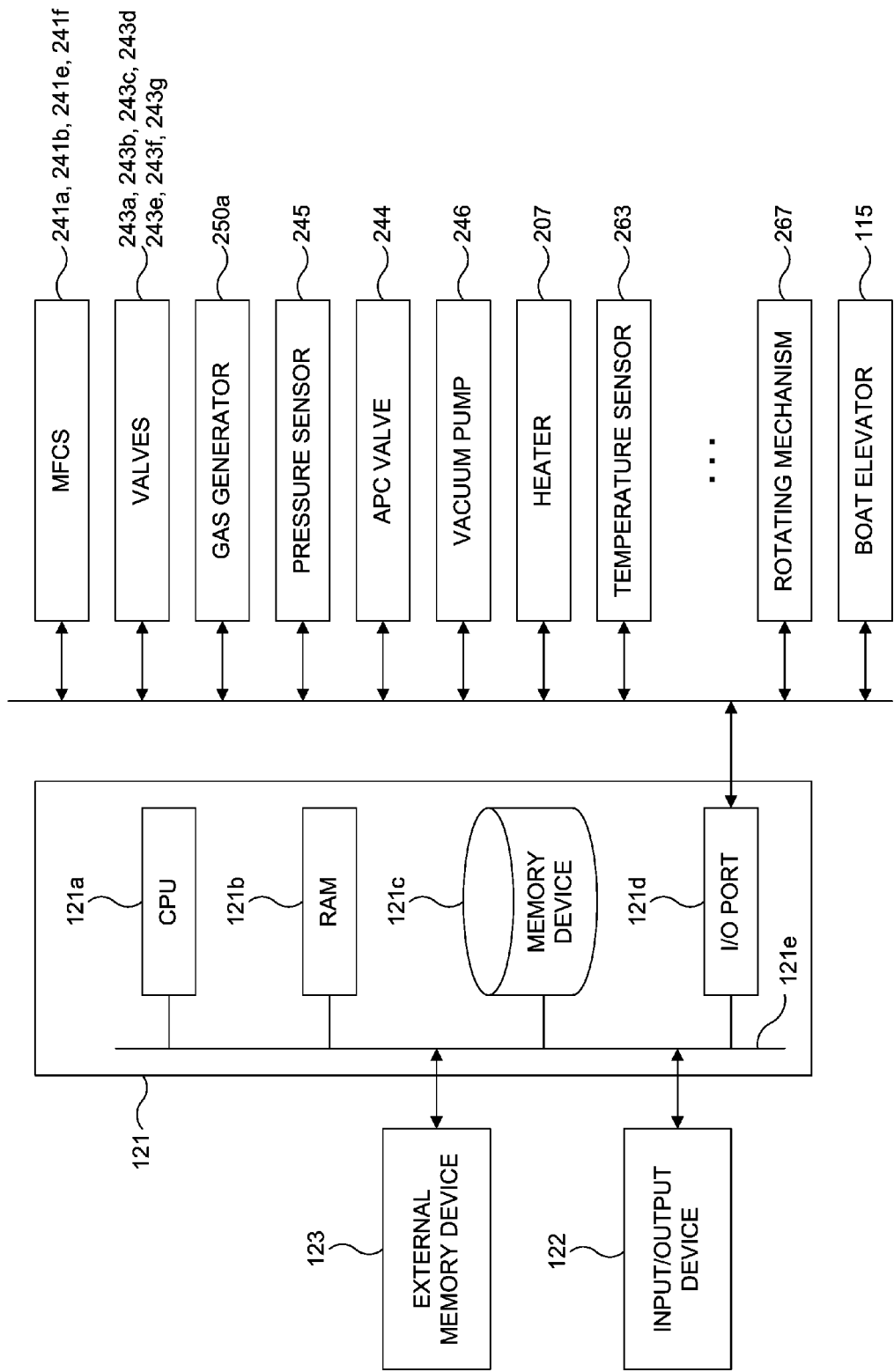
FIG. 2 is a block diagram schematically illustrating a configuration of a controller and components controlled by the controller of the substrate processing apparatus preferably used in the embodiments.

As shown in FIG. 1, a process furnace 202 of a substrate processing apparatus includes a reaction tube 203. The reaction tube 203 is made of a heat-resistant material such as quartz ($SiO_2$) and silicon carbide (SiC). The reaction tube 203 is cylindrical. A gas supply port 203p is provided at an upper end of the reaction tube 203 and a furnace opening is provided at a lower end of the reaction tube 203. A process chamber 201 is provided in a hollow cylindrical portion of the reaction tube 203. The process chamber 201 is configured to accommodate wafers including a wafer 200 serving as a substrate.

A seal cap 219 serving as a cover capable of sealing a lower end opening (that is, the furnace opening) of the reaction tube 203 airtightly is provided under the reaction tube 203. The seal cap 219 is made of a non-metallic material such as quartz, for example. A rotating mechanism 267 is provided under the seal cap 219. A rotating shaft 255 of the rotating mechanism 267 is connected to a boat 217. As the rotating mechanism 267 rotates the boat 217, the wafers including the wafer 200 supported by the boat 217 are rotated. The seal cap 219 may be moved upward/downward in the vertical direction by a boat elevator 115 serving as an elevating mechanism.

The boat 217 serving as a substrate retainer aligns the wafers including the wafer 200, for example, from 5 to 200 wafers in the vertical direction and supports the wafers, while the wafers are oriented horizontally and centered with each other. That is, the boat 217 supports (accommodates) the wafers with predetermined intervals therebetween. The boat 217 is made of a heat-resistant material such as quartz and SiC. The boat 217 includes a top plate 217a and a bottom plate 217b at the top and bottom. Insulating plates 218 are provided in multiple stages under the boat 217. The insulating plates 218 are made of a heat-resistant material such as quartz and SiC.

A heater 207 serving as a heating mechanism is provided on an outer side of the reaction tube 203. The heater 207 heats the wafer 200 accommodated in a wafer accommodating region to a predetermined temperature. The heater 207 may function as a liquefaction suppressing mechanism that applies thermal energy to a gas supplied into the process chamber 201 to suppress its liquefaction, or function as an excitation mechanism that activates the gas by heat. A temperature sensor 263 serving as a temperature detecting mechanism is provided in the reaction tube 203 along an inner wall of the reaction tube 203.

A gas supply pipe 232a is connected to the gas supply port 203p provided at the upper end of the reaction tube 203. A gas generator 250a serving as a vaporizer, a mass flow controller (MFC) 241a serving as a flow rate controller (flow rate control mechanism), a valve 243a serving as an opening/closing valve and a gas concentration meter 300a are installed in order at the gas supply pipe 232a.

A gas supply pipe 232b configured to supply a carrier gas (dilution gas) is connected to the gas supply pipe 232a between the valve 243a and the gas concentration meter 300a. An MFC 241b and a valve 243b are installed at the gas supply pipe 232b. An oxygen (O)-containing gas such as oxygen ($O_2$) gas, an inert gas such as a rare gas and nitrogen ($N_2$) gas and a mixed gas thereof may be used as the carrier gas.

A liquid supply pipe 232c serving as a first supply pipe configured to supply a liquid source (also referred to as a "first solution") is connected to the gas generator 250a. A hydrogen peroxide solution in which a concentration of the hydrogen peroxide ($H_2O_2$) is a first liquid source concentration can be used as the liquid source (first solution). In the present specification, as a typical example of the first liquid source concentration, the first liquid source concentration according to the embodiments may be set to 31%. In the present specification, the hydrogen peroxide solution refers to an aqueous solution obtained by dissolving the $H_2O_2$ which is a liquid at normal temperature in water ($H_2O$) as a solvent. A source tank 250t serving as a storage tank (also referred to as a "reservoir tank") configured to store the liquid source, a liquid mass flow controller (LMFC) 241c and a valve 243c are installed at the liquid supply pipe 232c.

A liquid supply pipe 232d serving as a second supply pipe configured to supply a dilution liquid source (also referred to as a "second solution") is connected to the liquid supply pipe 232c between the valve 243c and the gas generator 250a. A hydrogen peroxide solution in which a concentration of the hydrogen peroxide ($H_2O_2$) is a second liquid source concentration lower than the first liquid source concentration can be used as the dilution liquid source (second solution). In the present specification, for example, the second liquid source concentration according to the embodiments may be set to 2% or less. In the present specification, as a typical example of the second liquid source concentration, the second liquid source concentration according to the embodiments may be set to 0% (that is, pure water is used as the dilution liquid source). In the present specification, for example, the pure water free of the $H_2O_2$ (that is, the concentration of the hydrogen peroxide is 0%) may be used as the second solution in which the concentration of the hydrogen peroxide is the second liquid source concentration. An LMFC 241d and a valve 243d are installed at the liquid supply pipe 232d.

That is, by connecting the liquid supply pipe 232d to the liquid supply pipe 232c at the upstream side of the gas generator 250a, only a mixed solution of the liquid source and the dilution liquid source, only the liquid source or only the dilution liquid source can be supplied to the gas generator 250a. As the mixed solution, a hydrogen peroxide solution obtained by mixing a hydrogen peroxide solution containing the $H_2O_2$ at a concentration of 31% with the pure water, for example, a hydrogen peroxide solution diluted to a concentration of the $H_2O_2$ of about 5% is supplied to the gas generator 250a.

In the present specification, the first liquid source concentration of the hydrogen peroxide solution used as the liquid source to be diluted with the pure water is set to about 31%, which is the concentration generally used industrially as the concentration of the hydrogen peroxide solution. It is preferable that the first liquid source concentration is set to 35% or less, which is an upper limit at which the $H_2O_2$ in the solution can maintain a chemically stable state.

A gas supply pipe 232f configured to supply a pressurized gas into the source tank 250t is connected to the source tank 250t. An MFC 241f and a valve 243f are installed at the gas supply pipe 232f. The pressurized gas is used to push the liquid source in the source tank 250t into the liquid supply pipe 232c. For example, the same gas as the carrier gas may be used as the pressurized gas. In addition, a drain pipe 232g configured to discharge the liquid source from the inside of the source tank 250t is connected to the source tank 250t. A valve 243g is installed at the drain pipe 232g.

A gas supply pipe 232e configured to supply a vaporization carrier gas into the gas generator 250a is connected to the gas generator 250a. An MFC 241e and a valve 243e are installed at the gas supply pipe 232e. The vaporization carrier gas is used to atomize the solution supplied through the liquid supply pipes 232c and 232d to the gas generator 250a to facilitate vaporization. For example, the same gas as the carrier gas may be used as the vaporization carrier gas.

The gas generator 250a is configured to generate a vaporized gas by vaporizing the mixed solution of the liquid source and the dilution liquid source (or only the liquid source or only the dilution liquid source) or by converting the mixed solution (or only the liquid source or only the dilution liquid source) into mist state. For example, the gas generator 250a heats the mixed solution (or only the liquid source or only the dilution liquid source) to a predetermined temperature (vaporization temperature) under approximately atmospheric pressure to generate the vaporized gas. For example, the vaporization temperature may range from 120° C. to 200° C. In the present embodiment, when the mixed solution (or only the liquid source or only the dilution liquid source) is vaporized or converted into mist state, the mixed solution (or only the liquid source or only the dilution liquid source) is atomized by supplying the vaporization carrier gas together with the mixed solution (or only the liquid source or only the dilution liquid source) to the gas generator 250a. In the present specification, the range "120° C. to 200° C." includes 120° C. as a lower limit and 200° C. as an upper limit. That is, for example, "120° C. to 200° C." refers to "120° C. or more and 200° C. or less". The same also applies to other numerical ranges described herein such as a flow rate, a pressure and a concentration.

The vaporized gas of the mixed solution or the liquid source is a gas containing water vapor ($H_2O$) and the $H_2O_2$. Hereinafter, the vaporized gas is also referred to as an $H_2O_2$-containing gas. Particularly, when the dilution liquid source is pure water and only the dilution liquid source is vaporized, the vaporized gas of the dilution liquid source is a gas containing water vapor ($H_2O$) free of $H_2O_2$. That is, the vaporized gas of the dilution liquid source is water vapor.

Hereinafter, a gas containing the vaporized gas supplied from the gas generator 250a to the gas supply pipe 232a is generally referred to as a "process gas". In addition, the process gas used in the first modification step described later is also referred to as a "first process gas", and the process gas used in the second modification step described later is also referred to as a "second process gas". In addition, when the vaporization carrier gas or the carrier gas (dilution gas) is used, the process gas, the first dilution gas and the second process gas may further include the vaporization carrier gas or the carrier gas, respectively.

The $H_2O_2$ contained in the process gas is a kind of active oxygen. The $H_2O_2$ is unstable and easily releases oxygen (O), and generates hydroxyl radical (OH radical) having a very strong oxidizing power. Therefore, the $H_2O_2$-containing gas serves as a strong oxidizing agent in a substrate processing described later.

The gas concentration meter 300a is configured to measure (detect) the concentration of the $H_2O_2$ or the $H_2O$ contained in the process gas flowing through the gas supply pipe 232a. By analyzing the spectral spectrum of the infrared light that has passed through the process gas flowing in a cell, the gas concentration meter 300a is configured to measure the concentration of the $H_2O_2$ or the $H_2O$ contained in the process gas.

A vaporized gas supply system (also referred to as a "first supply system") is constituted mainly by the gas supply pipe 232a, the MFC 241a, the valve 243a and the gas concentration meter 300a. A carrier gas supply system (also referred to as a "second supply system") is constituted mainly by the gas supply pipe 232b, the MFC 241b and the valve 243b. A first liquid supply system (also referred to as a "third supply system") is constituted mainly by the source tank 250t, the liquid supply pipe 232c, the LMFC 241c and the valve 243c. A second liquid supply system (also referred to as a "fourth supply system") is constituted mainly by the liquid supply pipe 232d, the LMFC 241d and the valve 243d. A vaporization carrier gas supply system (also referred to as a "fifth supply system") is constituted mainly by the gas supply pipe 232e, the MFC 241e and the valve 243e. The pressurized gas supply system (also referred to as a "sixth supply system") is constituted mainly by the gas supply pipe 232f, the MFC 241f and the valve 243f.

An exhaust pipe 231 configured to exhaust an inner atmosphere of the process chamber 201 is connected to a lower portion of a side wall of the reaction tube 203. A vacuum pump 246 serving as a vacuum exhaust device is connected to the exhaust pipe 231 through a pressure sensor 245 and an APC (Automatic Pressure Controller) valve 244. The pressure sensor 245 serves as a pressure detector (pressure detecting mechanism) to detect an inner pressure of the process chamber 201, and the APC valve 244 serves as a pressure controller (pressure adjusting mechanism). An exhaust system is constituted mainly by the exhaust pipe 231, the APC valve 244 and the pressure sensor 245. The exhaust system may further include the vacuum pump 246.

Figure 3:
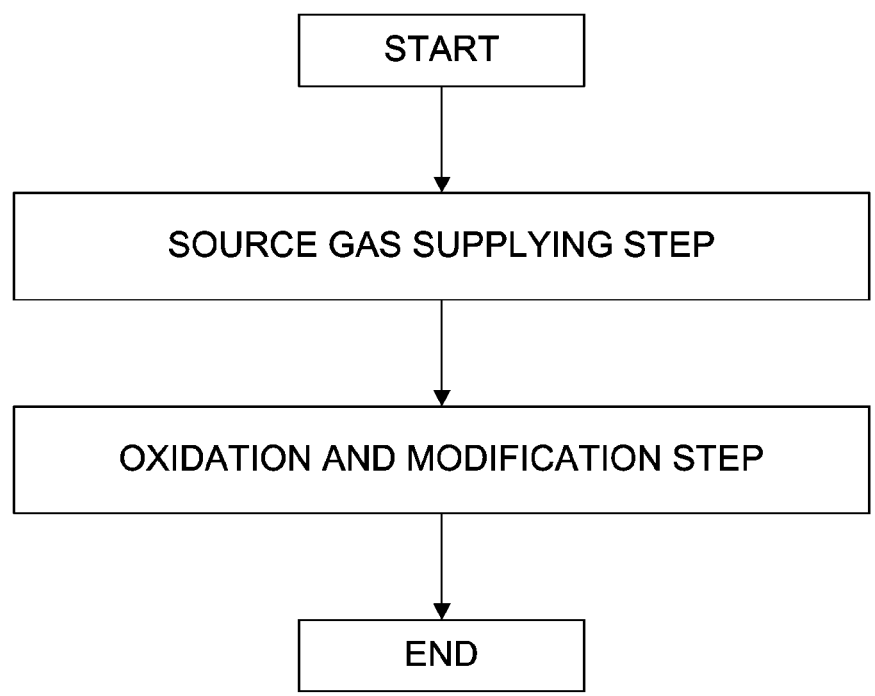
FIG. 3 illustrates a flowchart of a preprocessing according to the embodiments.

As shown in FIG. 3, a controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

The memory device 121c is configured by components such as a flash memory and HDD (Hard Disk Drive). A control program for controlling the operation of the substrate processing apparatus or a process recipe containing information on the sequences and conditions of a substrate processing described later is readably stored in the memory device 121c. The process recipe is obtained by combining steps of the substrate processing described later such that the controller 121 can execute the steps to acquire a predetermine result, and functions as a program. Hereafter, the process recipe and the control program are collectively referred to as a "program". The process recipe may be simply referred to as a "recipe". In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 241a, 241b, 241e and 241f, the LMFCs 241c and 241d, the valves 243a through 243g, the gas generator 250a, the gas concentration meter 300a, the pressure sensor 245, the APC valve 244, the vacuum pump 246, the heater 207, the temperature sensor 263, the rotating mechanism 267 and the boat elevator 115.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 121a may be configured to control various operations such as a gas generation operation by the gas generator 250a, flow rate adjusting operation by the MFCs 241a, 241b, 241e and 241f and the LMFCs 241c and 241d based on the gas concentration meter 300a, opening/closing operations of the valves 243a through 243g, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, an operation of adjusting rotation and rotation speed of the boat 217 by the rotating mechanism 267 and an elevating and lowering operation of the boat 217 by the boat elevator 115.

The controller 121 may be embodied by installing the above-described program stored in an external memory device 123 into a computer. For example, the external memory device 123 may include a magnetic disk such as a hard disk drive (HDD), an optical disk such as a CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) Preprocessing

Hereinafter, a preprocessing, which is performed before the substrate processing is performed on the wafer 200, will be described with reference to FIG. 3.

In the preprocessing, a silicon oxide film (also referred to as an "SiO film") is formed on the wafer 200 by a flowable CVD (FCVD) method. In particular, in the preprocessing, by using the flowable CVD method, it is possible to fill a gap structure such as a trench, which has a high aspect ratio (for example, 30 times or more) and is formed on a surface of the wafer 200, with the SiO film.

As shown in FIG. 3, in the preprocessing, a source gas supplying step and an oxidation and modification step are performed in order. In the source gas supplying step, for example, a silicon (Si)-containing film is formed on the surface of the wafer 200 by supplying trisilylamine (TSA) gas serving as a silicon-containing source gas onto the wafer 200. According to the flowable CVD method, the wafer 200 is cooled when the TSA gas is supplied so that the TSA gas supplied onto the surface of the wafer 200 gains liquid-like fluidity. As a result, the silicon-containing film is formed so as to fill the gap structure of the surface of the wafer 200.

Subsequently, in the oxidation and modification step, ozone ($O_3$) gas is supplied to the silicon-containing film formed on the wafer 200 to oxidize the silicon-containing film, thereby modifying the silicon-containing film into the SiO film. Instead of supplying the $O_3$ gas), the silicon-containing film may also be modified into the SiO film by performing an annealing process at about 300° C. while irradiating ultraviolet (UV) to the silicon-containing film in an oxidizing atmosphere.

Elements such as nitrogen (N) and hydrogen (H) contained in the silicon-containing source gas such as the TSA gas remain in the SiO film described above as impurities. The impurities in the SiO film may cause deterioration in the film characteristics of the SiO film. For example, when the impurities are contained in the SiO film, a wet etch rate (WER) for a solution such as hydrofluoric acid, which is one of indicators of the SiO film, may be increased. In the substrate processing step described later, the SiO film is modified (oxidized) by supplying the process gas to the SiO film formed on the wafer 200 under a predetermined temperature condition.

(3) Substrate Processing

Figure 4:
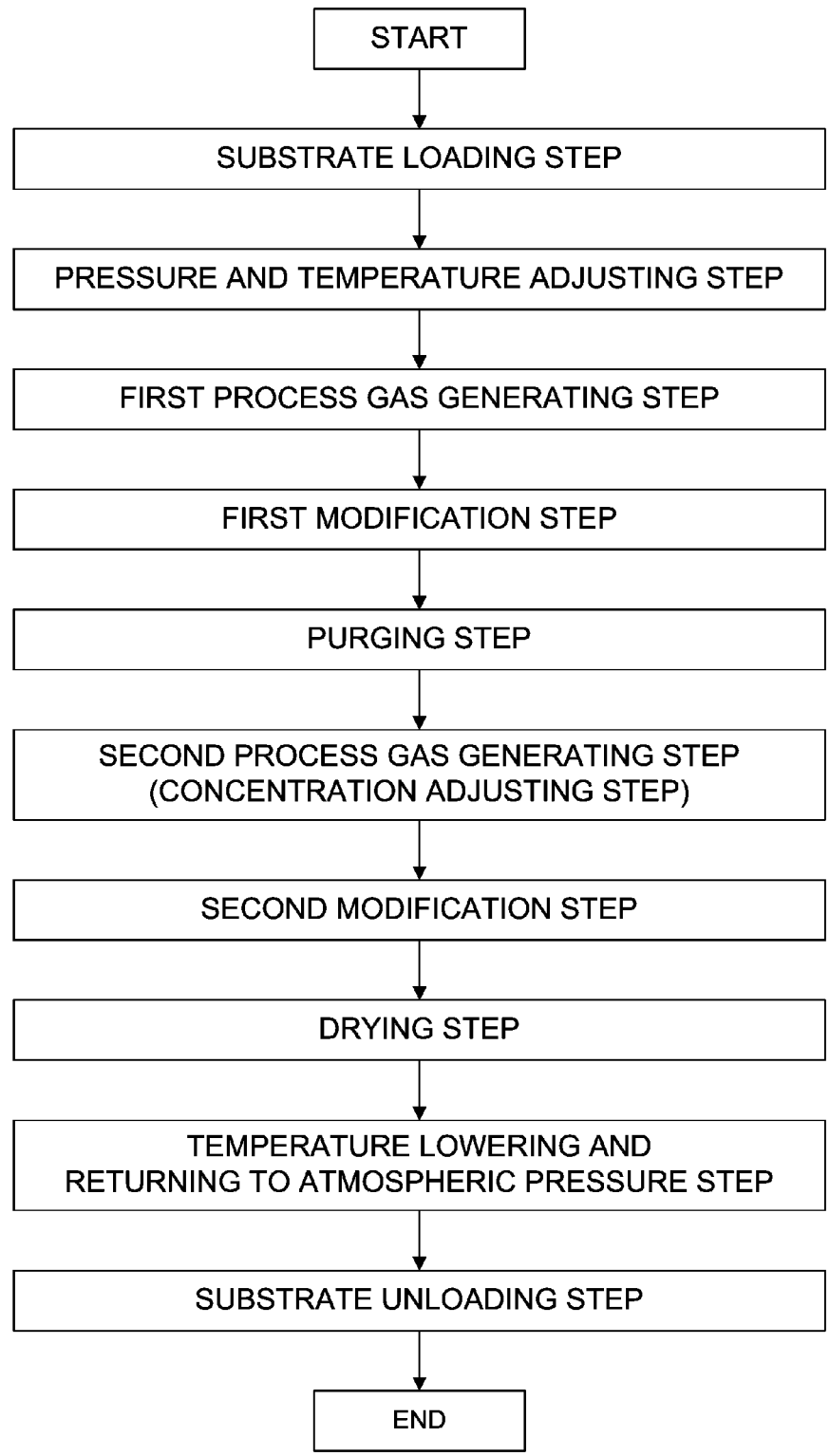
FIG. 4 illustrates a flowchart of a substrate processing performed after the preprocessing according to the embodiments.
Figure 5:
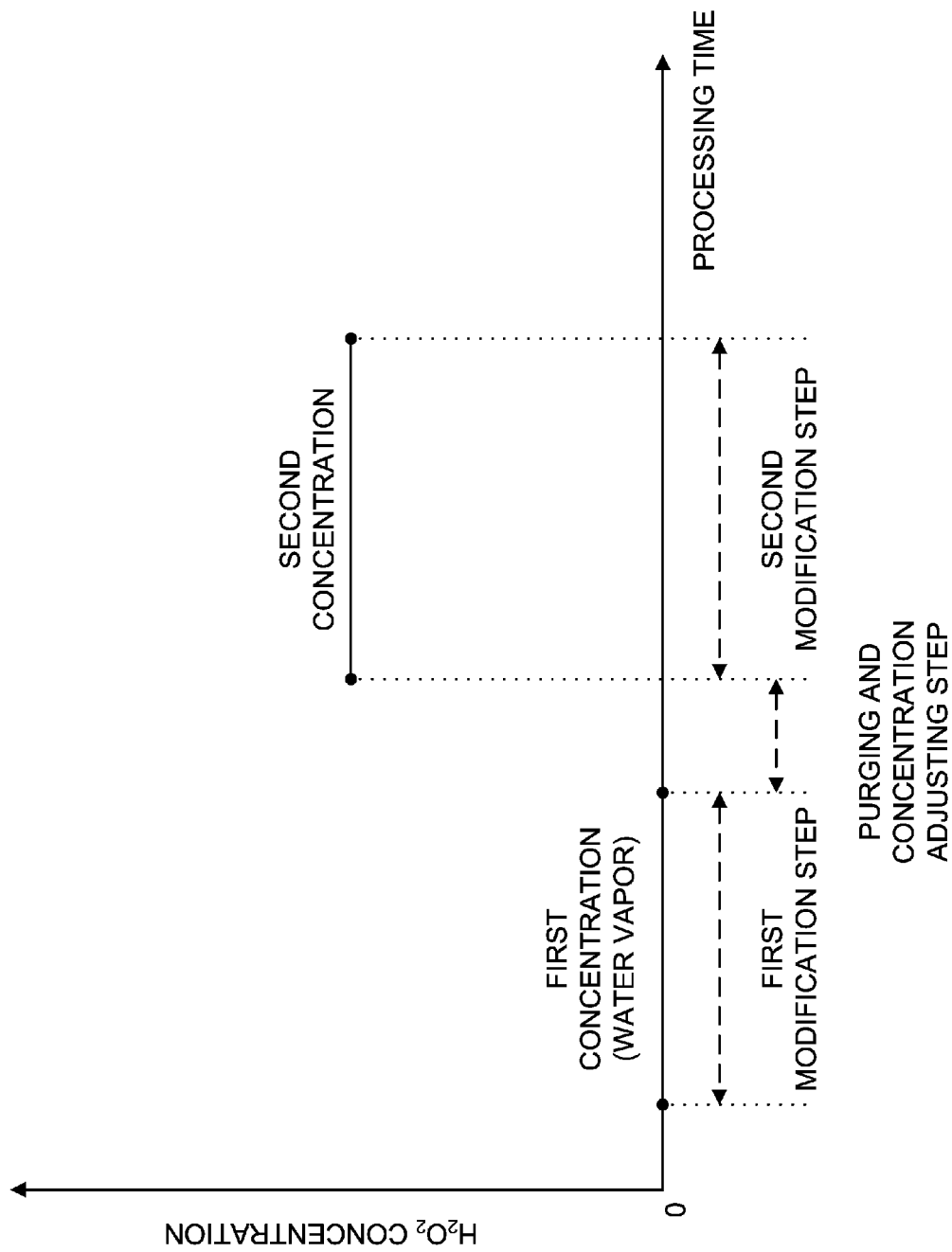
FIG. 5 illustrates a concentration of a process gas in the substrate processing according to the embodiments.

Hereinafter, the substrate processing, which is a part of the manufacturing processes of the semiconductor device, will be described with reference to FIGS. 4 and 5. FIG. 4 illustrates a flowchart of the substrate processing according to the embodiments. FIG. 5 illustrates a change in a concentration of the process gas with respect to a processing time in the substrate processing according to the embodiments. Hereinafter, the components of the substrate processing apparatus are controlled by the controller 121.

According to a film-forming sequence of the substrate processing shown in FIGS. 4 and 5, the first modification step (also referred to as a "first step") and the second modification step (also referred to as a "second step") are performed. In the first modification step, the first process gas is supplied to the wafer 200 having the silicon-containing film such as the SiO film formed on the surface thereof. The first process gas may include one of a gas containing the $H_2O$ free of the $H_2O_2$ and a gas containing the $H_2O$ and a first concentration of the $H_2O_2$. In the second modification step, the second process gas is supplied to the wafer 200 after the first modification step is performed. The second process gas may include a gas containing the $H_2O$ and a second concentration of the $H_2O_2$. The second concentration is higher than the first concentration, that is, the second process gas has a higher $H_2O_2$ concentration than the first process gas.

Substrate Loading Step

Wafers including the wafer 200 having the SiO film formed on the surfaces thereof by the flowable CVD method are loaded (charged) into the boat 217. After the boat 217 is charged with the wafers, the boat 217 accommodating the wafers is elevated by the boat elevator 115 and loaded into the process chamber 201 as shown in FIG. 1. With the boat 217 loaded, the seal cap 219 seals the lower end opening of the reaction tube 203.

Pressure and Temperature Adjusting Step

The vacuum pump 246 vacuum-exhausts the process chamber 201 where the wafers including the wafer 200 are accommodated until the inner pressure of the process chamber 201 reaches a predetermined pressure (modification pressure). In the pressure and temperature adjusting step, the inner pressure of the process chamber 201 is measured by the pressure sensor 245, and the APC valve 244 is feedback-controlled based on the measured pressure. The heater 207 heats the process chamber 201 until the temperature of the wafer 200 in the process chamber 201 reaches a predetermined temperature (first temperature). For example, the first temperature may be set to 400° C. in the embodiments. The state of electrical conduction to the heater 207 is feedback-controlled based on the temperature detected by the temperature sensor 263 such that the temperature of the wafer 200 reaches the first temperature. The rotating mechanism 267 starts to rotate the boat 217 and the wafer 200. Until at least the processing of the wafer 200 is completed, the vacuum pump 246 continuously vacuum-exhausts the process chamber 201, the rotating mechanism 267 continuously rotates the boat 217 (and the wafer 200) and the heater 207 continuously heats the process chamber 201.

First Process Gas Generating Step

Before performing the first modification step, in order to supply the first process gas containing the first concentration of the $H_2O_2$ to the wafer 200 in the first modification step, a first vaporized gas is generated in the gas generator 250a. In the first process gas generating step, pure water serving as the dilution liquid source is vaporized to generate a gas (water vapor) containing the $H_2O$ free of the $H_2O_2$ serving as the as the first process gas. That is, the first process gas may be generated by vaporizing the dilution liquid source (pure water) containing the second liquid source concentration (0%) of the hydrogen peroxide.

Specifically, the valves 243d and 243e are opened to supply the pure water and the vaporization carrier gas to the gas generator 250a while the flow rates of the pure water and the vaporization carrier gas are controlled (adjusted) by the LMFC 241d and the MFC 241e, respectively. Thereby, the water vapor is generated by the gas generator 250a. In the first process gas generating step, the LMFC 241d is controlled by the controller 121 such that the flow rate and the concentration of the vaporized gas (the first process gas) generated by the gas generator 250a are adjusted. When the amount and the concentration of the vaporized gas (the first process gas) are stabilized, the subsequent first modification step is started. While the first process gas generating step is started after the pressure and temperature adjusting step is performed in FIG. 4, the embodiments are not limited thereto. For example, the first process gas generating step may be started during or before the pressure and temperature adjusting step.

First Modification Step

Subsequently, the valve 243a is opened to supply the first process gas containing the first concentration of the $H_2O_2$ into the process chamber 201 through the MFC 241a, the gas supply pipe 232a and the gas supply port 203p. In the embodiments, as described above, the first process gas may include the gas containing the water vapor free of the $H_2O_2$. That is, the first concentration of the $H_2O_2$ may be 0%. That is, in the present specification, the gas containing the water vapor free of the $H_2O_2$ (that is, the first concentration is 0%) may be used as the first process gas containing the $H_2O$ and the first concentration of the $H_2O_2$. In addition, the first process gas in which the first concentration exceeds 0% (that is, the $H_2O_2$ is contained in the first process gas even a little) may be referred to as the "first process gas containing the $H_2O$ and the $H_2O_2$ whose concentration is the first concentration".

The first process gas supplied into the process chamber 201 flows downward in the process chamber 201, and is discharged to the outside of the process chamber 201 through the exhaust pipe 231. Thereby, the first process gas is supplied onto the wafer 200 and exhausted from the process chamber 201. While supplying the first process gas, the valve 243b may be opened to supply the carrier gas such as the oxygen ($O_2$) gas into the process chamber 201 through the gas supply pipe 232a and the gas supply port 203p. The flow rate of the carrier gas may be adjusted by the MFC 241b. When the carrier gas is supplied, the first process gas is diluted by the carrier gas ($O_2$ gas) in the gas supply pipe 232a and supplied into the process chamber 201. By adjusting the concentration of the $H_2O_2$ (partial pressure of $H_2O_2$ in the process chamber 201) of the first process gas by supplying the carrier gas ($O_2$ gas), it is possible to suppress the liquefaction of the first process gas supplied into the process chamber 201 and to adjust the modification rate of the silicon-containing film. The concentration of the $H_2O_2$ of the first process gas may be adjusted by changing the flow rate of the vaporization carrier gas or the flow rate of the dilution liquid source, which are supplied to the gas generator 250a.

For example, the processing conditions of the first modification step are as follows:

The flow rate of the dilution liquid source (pure water): from 1.0 sccm to 10 sccm, preferably from 1.6 sccm to 8 sccm;

Vaporization condition of the liquid source: Heating the liquid source at 120° C. to 200° C. under approximately atmospheric pressure;

Modification pressure: 700 hPa to 1,000 hPa (atmospheric pressure, slightly depressurized or slightly pressurized);

The temperature of the wafer 200 (first temperature): from 250° C. to 600° C., preferably from 400° C. to 600° C.; and Total flow rate of the $O_2$ gas used as the vaporization carrier gas and the carrier gas (dilution gas): from 0 SLM to 20 SLM, preferably 5 SLM to 10 SLM.

By supplying the first process gas to the wafer 200 according to the above-described processing conditions and maintaining the supply of the first process gas for a predetermined first time duration (for example, a time duration ranging from 20 minutes to 720 minutes), it is possible to modify (oxidize) the SiO film serving as the silicon-containing film formed on the wafer 200. That is, it is possible to add the oxygen (O) component contained in the first process gas into the silicon-containing film, and to desorb (remove) the impurities (first impurities) such as nitrogen (N) component and hydrogen (H) component contained in the silicon-containing film from silicon-containing film.

In the embodiments, the $H_2O_2$ contained in the $H_2O_2$-containing gas serving as the second process gas used in the subsequent second modification step has a very strong oxidizing power as described above. Therefore, in the first modification step, when a high-concentration the $H_2O_2$-containing gas is supplied to the wafer 200 instead of the first process gas, the silicon-containing film is modified rapidly from the surface of the silicon-containing film. The densification (hardening) may occur locally in a layer near the surface of the silicon-containing film as the modification progresses. However, in the first modification step according to the embodiments, by using the gas having the first concentration of the $H_2O_2$ (0% in the embodiments) lower than that of the second process gas as the first process gas, it is possible to modify (oxidize) the silicon-containing film with a relatively weak oxidizing power as compared with the second modification step. By performing the modification using the process gas having a relatively weak oxidizing power (that is, the first process gas), it is possible to allow the $H_2O$ component contained in the first process gas (and the $H_2O_2$ component when the $H_2O_2$ component is contained in the first process gas) to permeate into not only the surface of the silicon-containing film but also into the silicon-containing film (along the thickness direction of the silicon-containing film) while suppressing the local densification in the layer in the vicinity of the surface of the silicon-containing film. As a result, it is possible to obtain the effect of the above-mentioned modification not only on the surface of the silicon-containing film but also in the deepest portion of the silicon-containing film.

In order to obtain the effect of the modification over the entire region in the thickness direction (i.e., the entire depth) of the silicon-containing film, preferably, the first modification step may be continuously performed at least throughout the entire region in the thickness direction (i.e., the entire depth) of the silicon-containing film. That is, the first modification step may be continuously performed until the component such as the $H_2O$ component reaches the deepest portion of the silicon-containing film. It is preferable to increase the processing time (first time) of the first modification step as the thickness of the silicon-containing film increases.

The gas containing the water vapor free of the $H_2O_2$ may be preferably used as the first process gas to modify the silicon-containing film in the first modification step. However, when the temperature of the wafer 200 is lower than 250° C., the effect of the modification on the silicon-containing film may not be obtained. When the temperature of the wafer 200 is lower than 400° C., the effect of the modification on the silicon-containing film may be lowered. Therefore, it is preferable that the processing temperature of the first modification step is 400° C. or higher. However, when the gas containing the $H_2O_2$ is used as the first process gas, it is possible to lower the processing temperature of the first modification step lower than 250° C., for example, 80° C. to 250° C., since the effect of the modification on the silicon-containing film is expected even at a lower temperature by using the gas containing the $H_2O_2$. When the processing temperature of the first modification step is lower than 80° C., as described later, the first process gas may liquefy and the particles may be generated. Therefore, it is preferable that the processing temperature of the first modification step is 80° C. or higher.

In addition, when the temperature of the wafer 200 is 600° C. or higher, the influence of the thermal history (thermal budget) on the pattern formed on the wafer 200 exceeds the normally allowable range. Therefore, it is preferable that the processing temperature is less than 600° C.

Purging Step

After a predetermined time elapsed and the first modification step of modifying the silicon-containing film using the first process gas is completed, the valve 243a is closed to stop the supply of the first process gas to the wafer 200. Then, the first process gas and the by-products remaining in the process chamber 201 are discharged (purged) out of the process chamber 201 by the vacuum pump 246. When the $O_2$ gas is supplied through the gas supply pipe 232b in the first modification step, the valve 243b may be maintained open to supply the $O_2$ gas continuously until the next second modification step is started. Alternatively, the valve 243b may be closed simultaneously with the valve 243a to stop the supply of the $O_2$ gas or the valve 243b may be closed to stop the supply of the $O_2$ gas after a predetermined time from closing the valve 243a. When the purging step is unnecessary, the purging step may be omitted.

After the first modification step, the heater 207 is controlled such that the temperature of the wafer 200 in the subsequent second modification step is at a predetermined temperature (second temperature). For example, in the embodiments, the second temperature may be maintained at 400° C., which is the same as the first temperature. However, the second temperature may be different from the first temperature, and the temperature of the wafer 200 may be elevated or lowered to the second temperature in the purging step.

Second Process Gas Generating Step (Concentration Adjusting Step)

In the subsequent second modification step, a gas having a concentration of the $H_2O_2$ higher than that of the first process gas is supplied as the second process gas to the wafer 200. Therefore, after the first modification step and before performing the second modification step, a vaporized gas having the $H_2O_2$ concentration higher than that of the first process gas in the first process gas generating step is generated in the gas generator 250a in the second process gas generating step. In the second process gas generating step, a gas containing the $H_2O_2$ and the $H_2O$ is generated as the vaporized gas (second process gas) by vaporizing the hydrogen peroxide solution having a concentration of the $H_2O_2$ of about 31%, which is the liquid source. That is, the second process gas is generated by vaporizing the liquid source containing the first liquid source concentration (31%) of the hydrogen peroxide higher than the second liquid source concentration (0%). Unlike the first process gas generating step, the liquid source is not diluted with the pure water serving as the dilution liquid source in the second process gas generating step.

Specifically, with the valve 243e open, the valve 243d is closed and the valve 243c is opened to supply the liquid source and the vaporization carrier gas to the gas generator 250a while the flow rates of the liquid source and the vaporization carrier gas are controlled (adjusted) by the LMFC 241c and the MFC 241e, respectively. Thereby, the gas containing the $H_2O_2$ and the $H_2O$ is generated by the gas generator 250a. In the second process gas generating step, the LMFC 241c is controlled by the controller 121 such that the flow rate and the concentration of the vaporized gas (the second process gas) generated by the gas generator 250a are adjusted. When the amount and the concentration of the vaporized gas (the second process gas) are stabilized, the subsequent second modification step is started.

The second process gas generating step is provided to change the concentration of the vaporized gas generated by the gas generator 250a in the embodiments. However, the second process gas generating step may be unnecessary, for example, when the substrate processing apparatus includes a gas generator capable of generating the first process gas and a gas generator capable of generating the second process gas. When the second process gas generating step is unnecessary, the second process gas generating step may be omitted. In addition, preferably, the second process gas generating step may be performed in parallel with the purging step.

Second Modification Step

Subsequently, the second process gas containing the second concentration of the $H_2O_2$ is supplied into the process chamber 201 in the same manners as the first modification step. Similar to the first modification step, the oxygen ($O_2$) gas may be supplied into the process chamber 201. By adjusting the concentration of the $H_2O_2$ (partial pressure of $H_2O_2$ in the process chamber 201) of the second process gas by supplying the $O_2$ gas, it is possible to suppress the liquefaction of the second process gas (that is, the liquefaction of the $H_2O_2$ component in the second process gas) supplied into the process chamber 201 and to adjust the modification rate of the silicon-containing film. The concentration of the $H_2O_2$ of the second process gas may be adjusted by changing the flow rate of the vaporization carrier gas or the flow rate of the liquid source, which are supplied to the gas generator 250a.

For example, the processing conditions of the second modification step are as follows:

The $H_2O_2$ concentration of the liquid source: from 20% to 50%, preferably from 25% to 35%;

The flow rate of the liquid source: from 1.0 sccm to 10 sccm, preferably from 1.6 sccm to 8 sccm;

Vaporization condition of the liquid source: Heating the liquid source 120° C. to 200° C. under approximately atmospheric pressure;

Modification pressure: 700 hPa to 1,000 hPa (atmospheric pressure, slightly depressurized or slightly pressurized);

The temperature of the wafer 200 (second temperature): from 80° C. to 450° C., preferably from 250° C. to 400° C.; and Total flow rate of the $O_2$ gas used as the vaporization carrier gas and the carrier gas (dilution gas): from 0 SLM to 20 SLM, preferably 5 SLM to 10 SLM.

The $H_2O_2$-containing gas may be preferably used as the second process gas to modify the silicon-containing film in the second modification step. However, when the temperature of the wafer 200 exceeds 450° C., the $H_2O_2$ in the second process gas is decomposed rapidly. Therefore, it is difficult to maintain the $H_2O_2$ component in the process chamber 201 during the time period necessary for the second modification step. When the temperature of the wafer 200 exceeds 400° C., the concentration distribution of the $H_2O_2$ may be uneven in the process chamber 201 as the $H_2O_2$ in the second process gas is decomposed. When the temperature of the wafer 200 is lower than 80° C., it is difficult to suppress the liquefaction of the second process gas under the pressure conditions such as atmospheric pressure, slightly depressurized pressure and slightly pressurized pressure. When the temperature of the wafer 200 is lower than 250° C., there is a high possibility that the liquefaction of the second process gas occurs under the same pressure conditions and the particles in mist state are generated. The particles lead to deterioration of the quality of the device formed on the wafer 200.

In the embodiments, for example, by setting the temperature of the second modification step to 400° C. and maintaining the temperature of the wafer 200 to be constant in the first modification step and the second modification step, it is possible to save the time necessary for elevating or lowering the temperature between the first modification step and the second modification step. However, the temperature of the wafer 200 in the first modification step and the temperature of the wafer 200 in the second modification step may be different.

By supplying the second process gas to the wafer 200 according to the above-described processing conditions and maintaining the supply of the second process gas for a predetermined second time duration (for example, a time duration ranging from 5 minutes to 180 minutes), it is possible to further modify (oxidize) the SiO film serving as the silicon-containing film modified by the first modification step. Therefore, it is possible to further add the oxygen (O) component contained in the second process gas to into the silicon-containing film modified by the first modification step. Further, it is possible to desorb (remove) the impurities (second impurities) such as nitrogen (N) component and hydrogen (H) component remaining in the silicon-containing film, which are difficult to remove by performing the first modification step, from silicon-containing film.

In the embodiments, by performing the second modification step using the second process gas having the concentration of the $H_2O_2$ higher than that of the first process gas, it is possible to obtain oxidizing power stronger than the oxidizing power obtained by the first modification step.

In addition, in the embodiments, it is possible to allow the $H_2O$ component (and the $H_2O_2$ component when the $H_2O_2$ component is contained in the first process gas) to permeate into the silicon-containing film while suppressing the densification of the surface of the silicon-containing film by performing the first modification step using the first process gas having the concentration of the $H_2O_2$ lower than that of the second process gas before performing the second modification step. According to the verification by the inventors, the component such as the $H_2O$ permeates into the silicon-containing film in the first modification step, which may promote the permeation of the component such as the $H_2O_2$ into the silicon-containing film in the second modification step. Therefore, even in the second modification step performed using the second process gas having the concentration of the $H_2O_2$ higher than that of the first process gas, it is possible to allow the component such as the $H_2O_2$ to permeate into the silicon-containing film, and to obtain the effect of the modification by the component such as the $H_2O_2$ over the entire region in the thickness direction (i.e., the entire depth) of the silicon-containing film even to the deepest portion of the silicon-containing film.

According to the verification by the inventors, it is presumed that the component such as the $H_2O$ that has permeated in the first modification step may facilitate the desorption of the impurities (second impurities) remaining in the deepest portion of the silicon-containing film from the surface thereof in the second modification step.

As a result, it is possible to change (modify) the silicon-containing film modified in the first modification step to a high quality silicon oxide film (SiO film) having extremely low impurity concentrations over the entire region in the thickness direction (i.e., the entire depth) of the silicon-containing film.

Drying Step

After a predetermined time has elapsed and the second modification step of modifying the silicon-containing film using the second process gas is completed, the supply of the second process gas to the wafer 200 is stopped. Then, the wafer 200 is dried by supplying the 02 gas free of the $H_2O_2$. Preferably, the drying step is performed by maintaining the temperature of the wafer 200 at the temperature of the wafer 200 in the second modification step or by maintaining the temperature of the wafer 200 higher than the temperature of the wafer 200 in the second modification step. Therefore, it is possible to accelerate the drying of the wafer 200 in the drying step. That is, it is possible to efficiently desorb the $H_2O_2$ component and the $H_2O$ component inserted by performing the second modification step from the surface of the silicon oxide film or from the silicon oxide film (the modified silicon-containing film). In addition, by executing the drying step after the second modification step while maintaining the temperature of the wafer 200, it is possible to omit the temperature elevating process between the second modification step and the drying step, and to shorten the time from the end of the second modification step to the start of the drying step. It is also possible to obtain the effect of the modification by components such as the $H_2O_2$ and the $H_2O$ remaining in the silicon oxide film even in the drying step.

Temperature Lowering and Returning to Atmospheric Pressure Step

After the drying step is completed, the inner atmosphere of the process chamber 201 is vacuum-exhausted. Thereafter, the $N_2$ gas is supplied into the process chamber 201 to return the inner pressure of the process chamber to the atmospheric pressure and to increase the heat capacity in the process chamber 201. As a result, it is possible to uniformly heat the wafer 200 and the components in the process chamber 201, and to remove the particles, the impurities and residual gases that could not be removed by the vacuum-exhaust from the process chamber 201. After a predetermined time elapsed, the inside of the process chamber 201 is cooled to a predetermined temperature suitable for unloading the boat 217.

Substrate Unloading Step

Thereafter, the seal cap 219 is lowered by the boat elevator 115 and the lower end of the reaction tube 203 is opened. The boat 217 with the processed wafers including the wafer 200 charged therein is unloaded out of the reaction tube 203 through the lower end of the reaction tube 203. The processed wafers including the wafer 200 are then unloaded (discharged) from the boat 217 after the boat 217 is unloaded out of the reaction tube 203.

(4) Modified Examples

While the embodiments are described in detail, the embodiments are not limited thereto. For example, the embodiments may be modified in various ways as in the following modified examples. In addition, the modified examples may be arbitrarily combined.

First Modified Example

Figure 6:
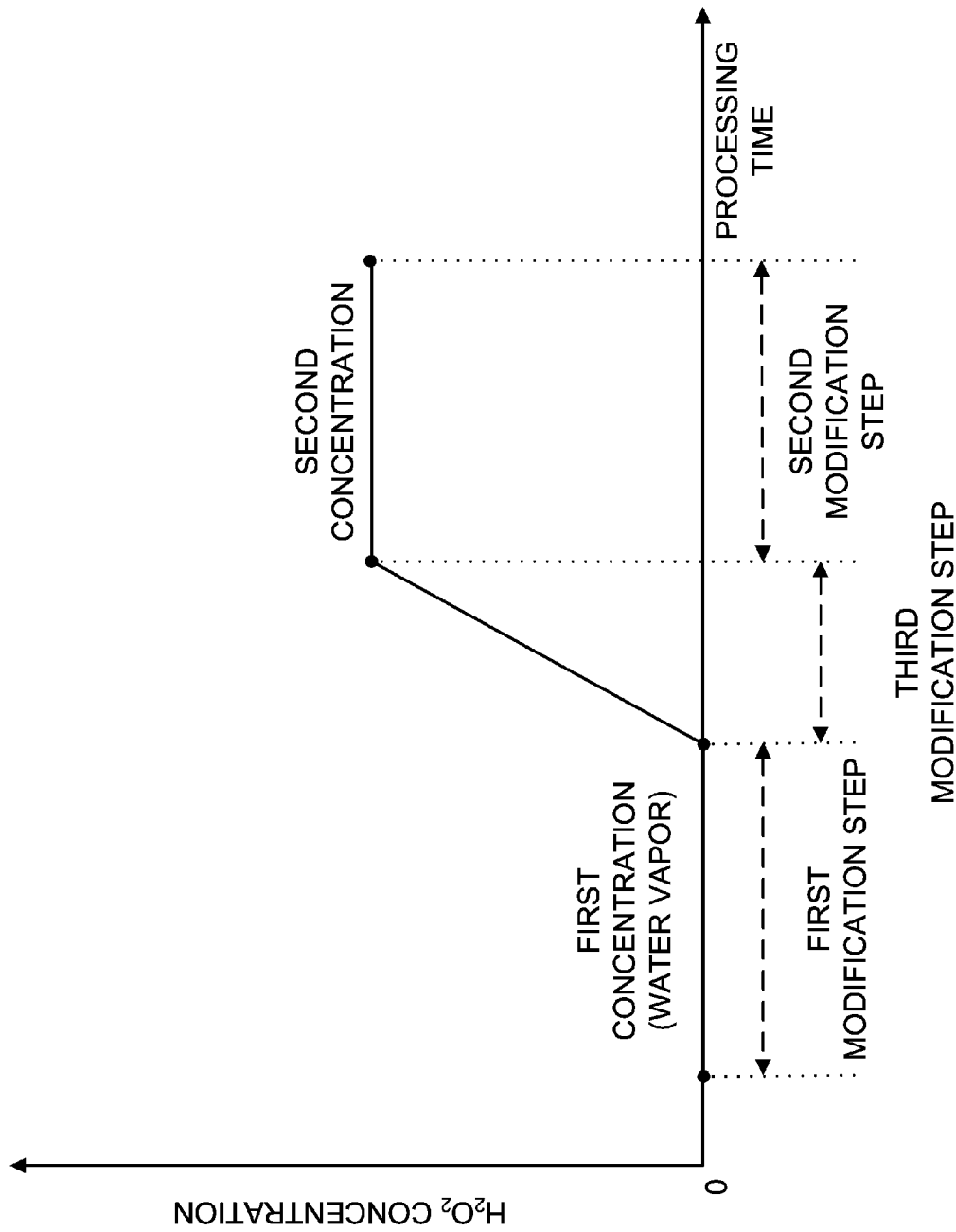
FIG. 6 illustrates a concentration of the process gas in a substrate processing according to a first modified example of the embodiments.

FIG. 6 illustrates the change in the concentration of the $H_2O_2$ in the process gas supplied to the wafer 200 with respect to the processing time according to a first modified example of the embodiments. In the first modified example, a third modification step (third step) of supplying a gas containing the $H_2O$ and the $H_2O_2$ to the wafer 200 is performed between the first modification step and the second modification step. In the third modification step, the gas containing the $H_2O$ and the $H_2O_2$ supplied to the wafer 200 while gradually increasing the concentration of the $H_2O_2$ contained in the gas containing the $H_2O$ and the $H_2O_2$. That is, the concentration of the $H_2O_2$ contained in the process gas (the gas containing the $H_2O$ and the $H_2O_2$) is continuously changed from the first concentration to the second concentration.

In the third step, with the valve 243d open, the valve 243c is opened to supply the liquid source, the dilution liquid source and the vaporization carrier gas to the gas generator 250a while the flow rates of the liquid source, the dilution liquid source and the vaporization carrier gas are controlled (adjusted) by the LMFCs 241c and 241d and the MFC 241e, respectively. The controller 121 controls the LMFCs 241c and 241d and the MFC 241e such that the concentration of the $H_2O_2$ in the vaporized gas generated by the gas generator 250a increases with time by adjusting the flow rate ratio of the liquid source to the dilution liquid source supplied to the gas generator 250a. That is, in the first modified example, by temporally changing the flow rate ratio of the liquid source to the dilution liquid source from 100:0 to 0:100, the concentration of the $H_2O_2$ in the process gas is changed from the first concentration to the second concentration.

When adjusting the flow rate ratio of the liquid source and the dilution liquid source supplied to the gas generator 250a, the LMFC 241c and the LMFC 241d may be feedback-controlled so that the concentration of the $H_2O_2$ in the process gas detected by the gas concentration meter 300a becomes a desired value. The same applies to other embodiments or the modified examples in which the concentration of the $H_2O_2$ in the process gas is controlled (adjusted).

According to the first modified example, it is possible to improve the throughput of the substrate processing since the above-described second process gas generating step (concentration adjusting step) can be omitted. In addition, as compared with the above-described embodiments, it is possible to improve the quality of the film even with the same substrate processing time. In the first modified example, the purging step described above is omitted.

Second Modified Example

Figure 7:
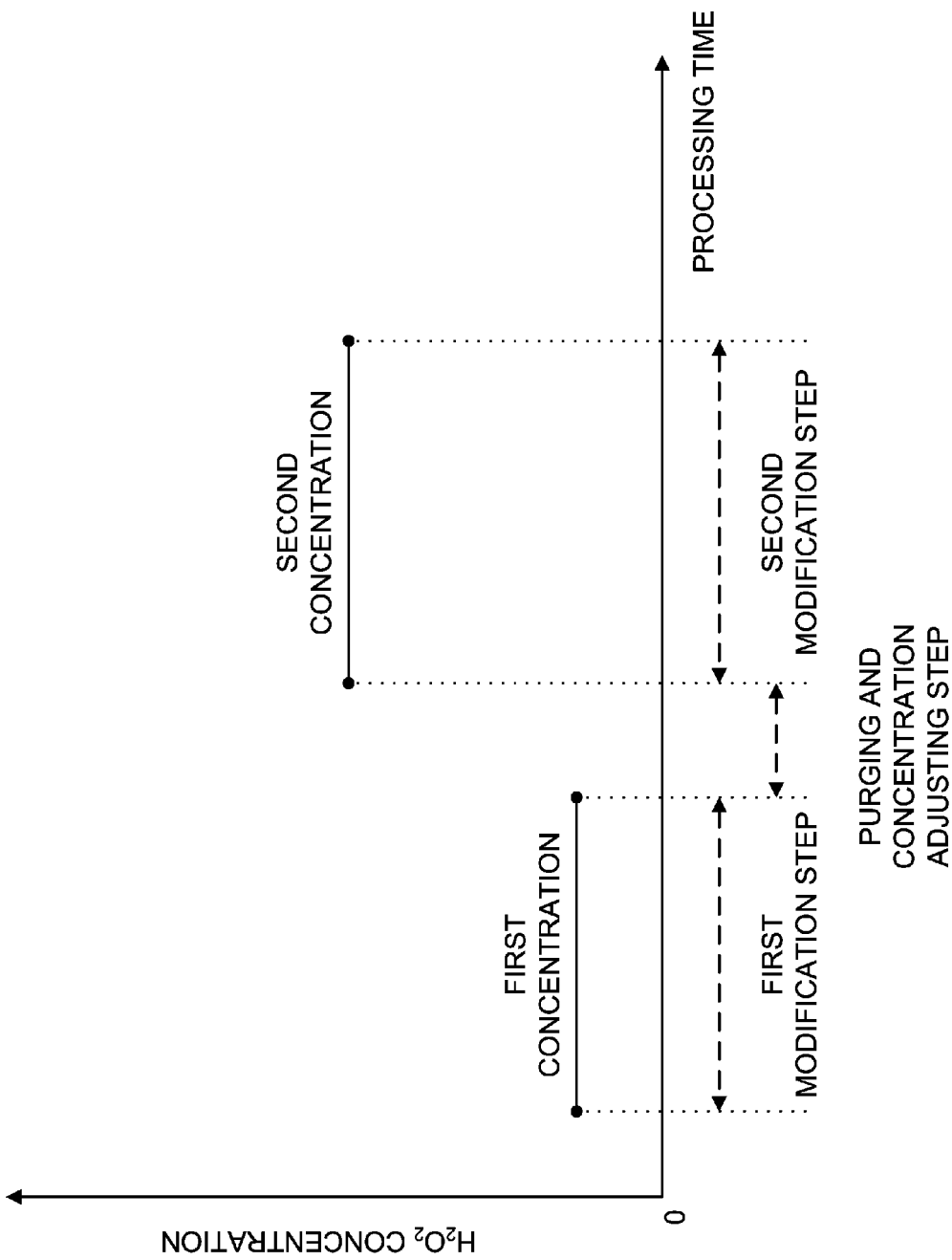
FIG. 7 illustrates a concentration of the process gas in a substrate processing according to a second modified example of the embodiments.

FIG. 7 illustrates the change in the concentration of the $H_2O_2$ in the process gas supplied to the wafer 200 with respect to the processing time according to a second modified example of the embodiments. In the second modified example, the first concentration which is the concentration of the $H_2O_2$ in the process gas (first process gas) in the first modification step is higher than 0 ppm and lower than the second concentration. That is, the first process gas is a gas containing the $H_2O$ and the $H_2O_2$.

In the second modified example, the $H_2O_2$-containing gas is generated as a vaporized gas by vaporizing the diluted hydrogen peroxide solution which is a mixed solution of the liquid source and the dilution liquid source in the first process gas generating step. Specifically, the valves 243c, 243d and 243e are opened to supply the mixed solution and the vaporization carrier gas to the gas generator 250a while the flow rates of the liquid source, the dilution liquid source and the vaporization carrier gas are controlled (adjusted) by the LMFCs 241c and 241d and the MFC 241e, respectively. Thereby, the $H_2O_2$-containing gas is generated by the gas generator 250a. The controller 121 controls the LMFCs 241c and 241d such that the concentration of the $H_2O_2$ in the vaporized gas generated by the gas generator 250a becomes a predetermined concentration by adjusting the flow rate ratio of the liquid source to the dilution liquid source supplied to the gas generator 250a. For example, the flow rate ratio is adjusted so that the concentration of the $H_2O_2$ in the mixed solution becomes a predetermined value between 1% to 5%.

According to the second modified example, it is possible to improve the throughput of the substrate processing and to shorten the time required for the substrate processing since the silicon-containing film is modified by using the process gas containing the $H_2O_2$ having a strong oxidizing power from the first modification step. In addition, as compared with the above-described embodiments, it is possible to improve the quality of the film even with the same substrate processing time according to the second modified example.

Third Modified Example

Figure 8:
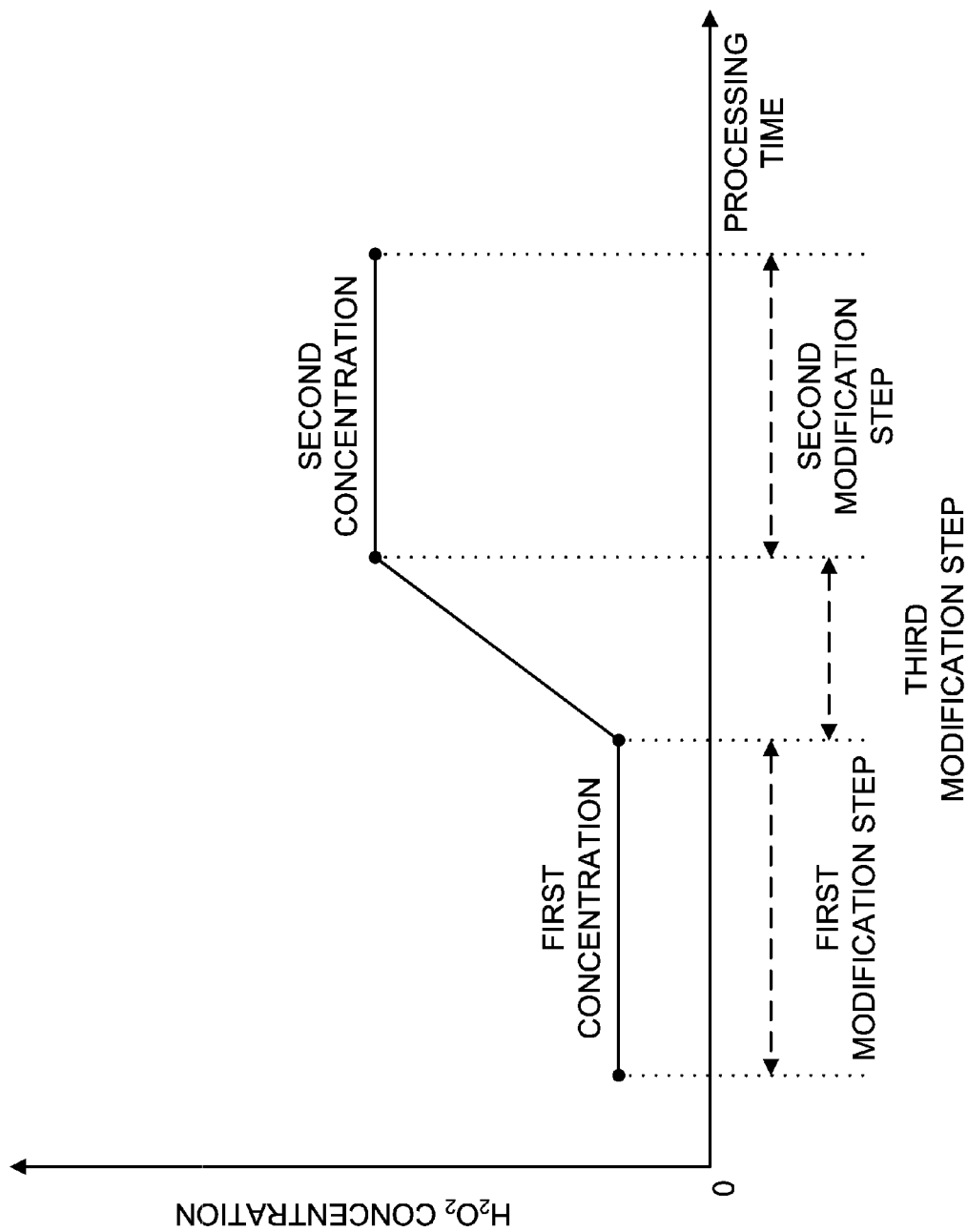
FIG. 8 illustrates a concentration of the process gas in a substrate processing according to a third modified example of the embodiments.

FIG. 8 illustrates the change in the concentration of the $H_2O_2$ in the process gas supplied to the wafer 200 with respect to the processing time according to a third modified example of the embodiments. The third modified example is a combination of the first modified example and the second modified example. That is, in the third modified example, the first concentration which is the concentration of the $H_2O_2$ in the process gas (first process gas) in the first modification step is higher than 0 ppm and lower than the second concentration and the first process gas is a gas containing the $H_2O$ and the $H_2O_2$ similar to the second modified example. In addition, in the third modified example, a third modification step (third step) of supplying a gas containing the $H_2O$ and the $H_2O_2$ to the wafer 200 is performed between the first modification step and the second modification step similar to the first modified example. That is, in the third modified example, the gas containing the $H_2O$ and the $H_2O_2$ supplied to the wafer 200 while gradually increasing the concentration of the $H_2O_2$ contained in the gas containing the $H_2O$ and the $H_2O_2$ similar to the first modified example. According to the third modified example, effects similar to those of the first modified example and the second modified example may be obtained.

Other Embodiments

While the technique is described in detail by way of the above-described embodiments and the modified examples, the above-described technique is not limited thereto. The above-described technique may be modified in various ways without departing from the gist thereof.

For example, the above-described embodiments are described by way of an example in which the substrate having the SiO film formed on the surface thereof is processed by the flowable CVD method. However, the above-described technique is not limited thereto. That is, even if a film to be processed is not a SiO film formed by the flowable CVD method, the above-described technique may be applied to processing the film, and the same advantageous effects as the above-described embodiments and the modified examples may be obtained.

Figure 9:
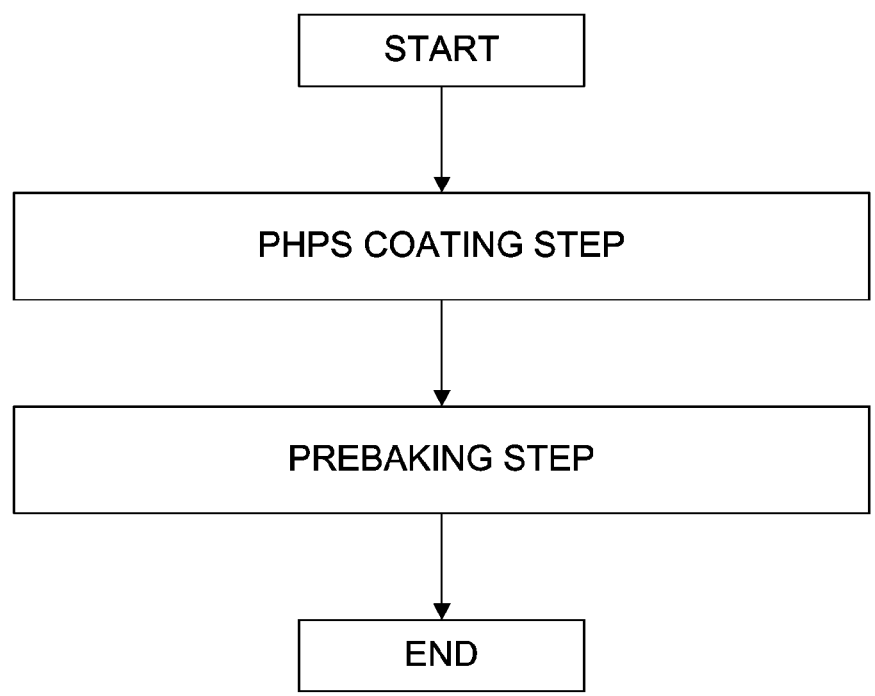
FIG. 9 illustrates a flowchart of a preprocessing according to another embodiment described herein.

For example, the advantageous effects can be obtained by applying the above-described substrate processing to a substrate having a polysilazane (PHPS) film which is a silicon-containing film formed by the following steps. FIG. 9 illustrates a flowchart for forming the PHPS film on the surface of the substrate.

In order to form the PHPS film on the surface of the substrate, a polysilazane (PHPS) coating step and a prebaking step are sequentially performed. In the PHPS coating step, a coating liquid (polysilazane solution) containing the polysilazane is coated onto the surface of the wafer 200 by a method such as a spin coating method. In the prebaking step, the solvent is removed from the coated film by heating the wafer 200 having the coated film formed thereon. By heating the wafer 200 having the coated film formed thereon at a processing temperature (prebaking temperature), it is possible to volatilize the solvent from the coated film. For example, the prebaking temperature may range from 70° C. to 250° C.

The coated film formed on the surface of the wafer 200 becomes a film having a silazane bond (—Si—N—), that is, a polysilazane film by performing the prebaking step. The polysilazane film contains nitrogen (N) and hydrogen (H) in addition to silicon (Si). The polysilazane film may further contain carbon (C) and other impurities in some cases. According to another embodiment of the above-described technique, by processing the polysilazane film formed with the process gas containing the $H_2O_2$ similar to the above embodiments, the nitrogen constituting the silazane bond is removed to modify (oxidize) the polysilazane film. That is, the polysilazane film is modified (oxidized) into an SiO film.

According to the above-described embodiments, the vaporized gas supply system of the substrate processing apparatus has a configuration in which the liquid supply pipe 232c configured to supply the liquid source and the liquid supply pipe 232d configured to supply the dilution liquid source are merged on the upstream side of the gas generator 250a. However, the configuration of the vaporized gas supply system of the above-described technique is not limited thereto. That is, the liquid supply pipe configured to supply the liquid source and the liquid supply pipe configured to supply the dilution liquid source may be separately connected to the gas generator. Alternatively, instead of providing the liquid supply pipe configured to supply the dilution liquid source, the concentration of the liquid source to be supplied to the gas generator may be switched by replacing the liquid source stored in the source tank 250t.

The above-described embodiments and the modified examples may be appropriately combined. The processing sequences and the processing conditions of the combinations may be substantially the same as those of the above-described embodiments.

EXAMPLES

Hereinafter, examples will be described.

In order to prepare a first sample, a second sample and a third sample, the SiO film formed on the wafer is modified by the flowable CVD method, respectively. The samples are prepared using the substrate processing apparatus shown in FIG. 1. The first sample is manufactured by only performing the first modification step without performing the second modification step in the above-described embodiments. The second sample is manufactured by only performing the second modification step without performing the first modification step in the above-described embodiments. The third sample is manufactured according to the processing sequences and the processing conditions the same as those of the above-described embodiments, that is, by performing the first modification step and the second modification step in order. The other processing conditions for manufacturing the samples are the same as those of the above-described embodiments. When the samples are manufactured, an annealing process with the water vapor is performed before the drying step. The processing temperature in the drying step is 600° C.

When preparing the films of the first sample, the second sample and the third sample, the processing time of each step is set to 1 hour. However, the processing time of the first modification step of the first sample and the processing time of the second modification step of the second sample are set to 2 hours, respectively, so that the total processing time (2 hours) of the first modification step and the second modification step of the third sample is equal to the sum of the processing time of the first modification step of the first sample and the processing time of the second modification step of the second sample. The processing temperature in the first modification step and the second modification step is 400° C. as in the above embodiments.

Figure 10:
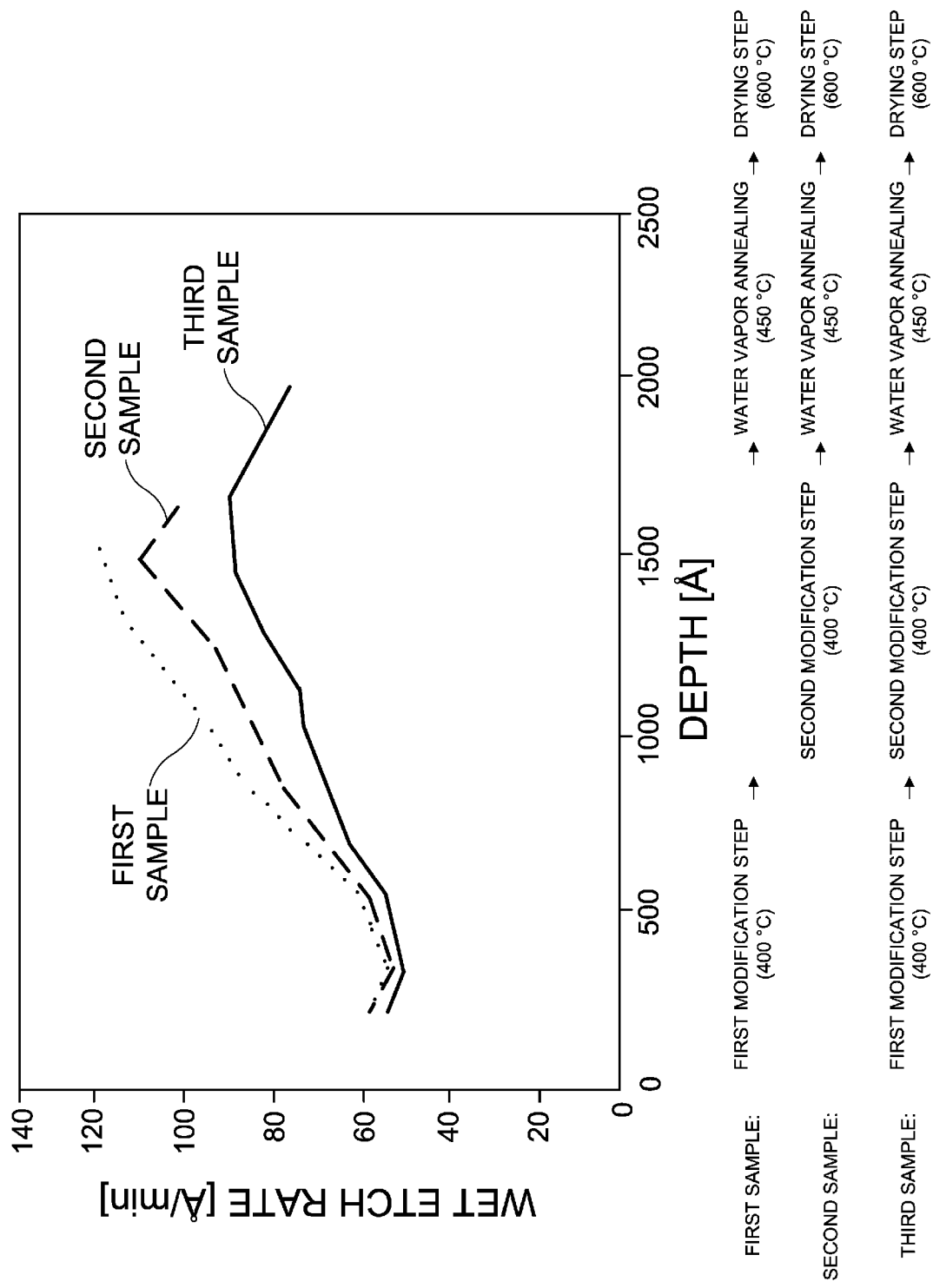
FIG. 10 illustrates measurement results of wet etch rates (WERs) of samples according to the embodiments and comparative examples.

Then, the wet etch rate (WER) values of the films of the first though the third samples are measured. FIG. 10 illustrates evaluation results. In FIG. 10, the horizontal axis represents the depth (nm) from the surface of the film and the vertical axis represents WER (Å/min) of the film at the depth from the surface of the film. Referring to FIG. 10, it is confirmed that the WER value over the entire region in the thickness direction (i.e., the entire depth) of the film is remarkably reduced in the third sample as compared with the first sample and the second sample. That is, by performing the first modification step and the second modification step in order, it is possible to modify the SiO film formed on the wafer into a SiO film having a good quality, that is, the SiO film having extremely low concentrations of impurities such as nitrogen and hydrogen which increase the WER over the entire region in the thickness direction of the film (i.e., the entire depth). In addition, it is difficult to obtain the same effects as in the third sample when only the first modification step is performed and the second modification step is not performed as in the first sample or when the second modification step is performed and the first modification step is not performed as in the second sample.

According to the technique described herein, it is possible to improving a quality of a substrate processing performed using hydrogen peroxide.

What is claimed is:

1. A method of manufacturing a semiconductor device, comprising:
   (a) supplying a first process gas containing water and a first concentration of hydrogen peroxide to a substrate having a silicon-containing film formed on a surface thereof; and
   (b) supplying a second process gas containing water and a second concentration of hydrogen peroxide higher than the first concentration to the substrate after (a).

2. The method of claim 1, wherein the silicon-containing film is oxidized in (a) and the silicon-containing film oxidized in (a) is further oxidized in (b).

3. The method of claim 1, wherein impurities contained in the silicon-containing film are removed in (a) and (b).

4. The method of claim 1, wherein the silicon-containing film comprises a silicon oxide film containing impurities.

5. The method of claim 3, wherein the impurities comprise at least one of hydrogen and nitrogen.

6. The method of claim 3, wherein the silicon-containing film comprises a film containing a silazane bond.

7. The method of claim 6, wherein nitrogen contained in the silicon-containing film is removed in (a) and (b).

8. The method of claim 1, wherein the first process gas comprises water vapor free of hydrogen peroxide.

9. The method of claim 1, wherein the first process gas comprises water vapor free of hydrogen peroxide, and a temperature of the wafer is within a range from 250° C. to 600° C. in (a).

10. The method of claim 9, wherein the temperature of the wafer is within a range from 400° C. to 600° C. in (a).

11. The method of claim 1, wherein the first process gas contains water and hydrogen peroxide, and the temperature of the wafer is within a range from 80° C. to 250° C. in (a).

12. The method of claim 1, wherein the first process gas is continuously supplied for a first time duration in (a), and the second process gas is continuously supplied for a second time duration in (b).

13. The method of claim 12, wherein the first process gas is continued to be supplied until the water permeates into the silicon-containing film throughout an entire region in a thickness direction of the silicon-containing film in (a).

14. The method of claim 1, further comprising:
   (c) supplying a gas containing water and hydrogen peroxide to the substrate between (a) and (b) while continuously increasing a concentration of hydrogen peroxide contained in the gas.

15. A non-transitory computer-readable recording medium storing a program used for a substrate processing apparatus, wherein the program causes the substrate processing apparatus to perform:
   (a) supplying a first process gas containing water and a first concentration of hydrogen peroxide to a substrate having a silicon-containing film formed on a surface thereof in a process chamber of the substrate processing apparatus; and (b) supplying a second process gas containing water and a second concentration of hydrogen peroxide higher than the first concentration to the substrate after (a).

* * * * *